United States Patent
Miyakawa

[19]

[11] Patent Number: 5,869,397
[45] Date of Patent: Feb. 9, 1999

[54] METHOD OF MANUFACTURING SEMICONDUCTOR DEVICE

[75] Inventor: Kuniko Miyakawa, Tokyo, Japan

[73] Assignee: NEC Corporation, Tokyo, Japan

[21] Appl. No.: 6,309

[22] Filed: Jan. 13, 1998

[30] Foreign Application Priority Data

Jan. 13, 1997 [JP] Japan .................................... 9-003540

[51] Int. Cl.$^6$ ........................ H01L 21/265; H01L 21/283
[52] U.S. Cl. .......................... 438/655; 438/656; 438/659; 438/683
[58] Field of Search .................................... 438/592, 649, 438/655, 656, 659, 683; 257/764

[56] References Cited

U.S. PATENT DOCUMENTS

| | | | |
|---|---|---|---|
| 5,389,575 | 2/1995 | Chin et al. | 438/653 |
| 5,624,869 | 4/1997 | Agnello et al. | 438/602 |
| 5,739,064 | 4/1998 | Hu et al. | 483/528 |

OTHER PUBLICATIONS

Choi, J., et al., "Thermally stable ternary titanium–tantalum silicide formation on polycrystalline silicon", J. Appl. Phys., vol. 74, No. 2, 15 Jul. 1993, pp. 1456–1458.

Fujii, K., et al., "A Thermally Stable Ti–W Salicide for Deep–Submicron Logic with Embedded DRAM", IEEE IEDM Tech. Digest, Dec. 1996, pp. 451–454.

S.L. Hsia et al., "Resistance and Structural Stabilities of Epitaxial CoSi$_2$ Films on (001) Si Substrates", J. Appl. Phys., vol. 72, No. 5, Sep. 1992, pp. 1864–1873.

*Primary Examiner*—T. N. Quach

[57] ABSTRACT

On a silicon substrate (1) is formed a MOS transistor which comprises a gate oxide film (3), a polysilicon gate electrode (4), an LDD diffusion layer (5) and a source/drain diffusion layer (7). A Ti film (8) is formed over the entire surface of the MOS transistor, the surface areas of the source/drain diffusion layer (7) and the polysilicon gate electrode (4) are silicified to form Ti silicide film (9, 10). Thereafter, W or Ta is ion-implanted as an alloy forming material into Ti silicide (10), and an anneal treatment is performed to react doped W or Ta with Ti silicide (10) and form TiW$_x$Si$_y$ or TiTa$_x$Si$_y$ (11).

7 Claims, 3 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and particularly to a method of manufacturing a semiconductor device wherein stable and high heat-resistant silicide is formed with high productivity by using a salicide process.

2. Description of the Related Art

A silicide structure using high melting-point metal has been hitherto proposed in order to reduce an electrical resistance of impurity diffusion layers and polysilicon layers of semiconductor devices, and particularly a salicide forming process using high melting-point metal such as Ti (titanium) has been used. According to the salicide forming process, an element isolation oxide film, a gate oxide film and a gate polysilicon electrode are formed on a silicon substrate, then a side wall made of an insulating film is formed on the lateral surface of the gate polysilicon electrode, and then source/drain diffusion layers are formed. In such a state that these diffusion layers and the polysilicon gate electrode are exposed to the outside, As (arsenic) is doped to make amorphous the surface area of the diffusion layers and the gate polysilicon electrode, and then a pure Ti film is formed at a temperature of 300° C. or more by a sputtering process and then subjected to a ramp anneal heat treatment to form Ti silicide ($TiSi_2$) having C49 crystal structure on the surfaces of the diffusion layers and the polysilicon gate electrode. Thereafter, those portions which are not silicified on the oxide film are selectively removed by a wet etching treatment, and further the ramp anneal treatment is performed again to make $TiSi_2$ have stable C54 crystal structure having reduced resistance.

The recent microstructure (minute) design of devices has caused the junction of the diffusion layer to be shallow, and when the junction of the diffusion layer is shallow, it is required that the thickness of silicide on the diffusion layer is set to 50 nm or less. In addition, the dimension in the lateral direction is reduced, so that the width of the diffusion layer is reduced and also the gate width is reduced. Therefore, $TiSi_2$ agglomerates on the diffusion layers and the gate because the surface energy of $TiSi_2$ becomes smaller when it agglomerates rather than it forms a film on silicon. Therefore, the silicide portion and the Si portion are arranged in the spot form, and thus the resistance is increased and the dispersion of the resistance is also increased. In addition, since thin film silicide is more liable to agglomerate as the temperature increases, it starts agglomeration when the heat treatment is performed at 750° C. or more, and the resistance increases more greatly and the dispersion thereof becomes more remarkable particularly in the case of narrow line patterns. In the present CMOS process, there are some cases where the process using a temperature of 750° C. or more is needed after silicide is formed. Further, even in a case where the silicide process is applied to another device, the application of silicide is greatly limited because the silicide has no resistance to heat of 750° C. or more.

As described above, $TiSi_2$ has the lowest specific resistance among suicides, however, the heat resistance thereof is lowered. Accordingly, in order to enhance the heat resistance with suppressing the increase of the resistance value as much as possible, it is expected that the resistance could be suppressed and the heat resistance could be enhanced if an alloy of Ti and metal of high melting point is used in place of pure Ti. From this viewpoint, an alloy of Ti and W (tungsten) or Ta (tantalum) has been proposed. W and Ta each has a melting point of 3000° C. or more, and this melting point is sufficiently higher than 1668° C. and 1540° C. which are the melting points of pure Ti and $TiSi_2$ respectively. The relationship between the melting point of the metal of high melting point to be mixed and the heat resistance of silicide obtained has not been clarified at present, however, it is estimated that high melting-point metals of W, Ta, etc. having a higher melting point than Ti and $TiSi_2$ suppress diffusion of Ti or Si at the grain boundaries to exhibit a heat resistance effect in the process that $TiSi_2$ is constricted at grain boundaries and agglomerates as described by S. L. Hsia et al. in the paper "Resistance and Structural Stabilities of Epitaxial $CoSi_2$ Films on (001) Si Substrates" (Journal of Applied Physics, Vol. 72, P1864–1873 (1992)).

However, as a conventional method of forming high heat-resistant silicide as described above, a target of high melting-point alloy is disposed in a sputtering apparatus in a Ti film-forming process in the salicide process as described above, an alloy film containing Ti is formed using the alloy target in the sputtering process, and high heat-resistant silicide is formed by using the salicide process. Therefore, in the case where the desired heat resistance of individual silicide is varied in accordance with the purpose of a device to be manufactured, it is necessary to prepare plural different alloy targets and exchange an alloy target to another in conformity with the device to be manufactured. Therefore, the management of the alloy target is cumbersome, and a process of exchanging the alloy target to another is required, so that the productivity of the device is lowered.

SUMMARY OF THE INVENTION

An object of the present invention is to provide a method of manufacturing a semiconductor device which can prepare alloy silicide having high heat resistance with high productivity.

In order to attain the above object, a semiconductor device manufacturing method according to the present invention comprises a step of forming a Ti film on a layer containing silicon such as an impurity diffusion layer of a silicon substrate, polysilicon layer, etc., a step of performing a heat treatment to react the Ti film with silicon to form Ti silicide, a step of removing a non-reacted portion of the Ti film, a step of subjecting the Ti silicide to ion implantation of high melting-point metal other than Ti, and an annealing step of reacting the implanted high melting-point metal with Ti silicide. W or Ta may be used as the high melting-point metal to be ion-implanted. Further, it is preferable that before the ion implantation of the high melting-point metal, an oxide thin film is formed so as to cover the Ti silicide, and the high melting-point metal is ion-implanted through the oxide thin film. Further, it is preferable that the ion-implantation of W or Ta is performed with an acceleration energy of 10 to 100 keV at a dose amount of 1E14 to $1E16/cm^3$. Further, the anneal treatment is preferably performed under oxidation atmosphere.

According to the present invention, high melting-point metal such as W, Ta or the like is ion-implanted into Ti silicide, and then annealed to react with Ti silicide, thereby forming Ti alloy silicide. Therefore, the step of forming Ti alloy film by the sputtering process is unnecessary. Therefore, even in the case where silicide having desired heat resistance which is varied in accordance with the purpose of the device is formed, the work of preparing different alloy targets and exchanging an alloy target for another is unnecessary, and thus the productivity is enhanced. Further, the high heat-resistant silicide can be stably formed, and the margin of the temperature condition after the formation of silicide can be set to be larger. In addition, the application range of silicide to the device process can be enlarged, and the process margin is set to be larger, resulting in enhancement of yield.

DETAILED DESCRIPTION OF THE PREFERRED EMBODIMENTS

Preferred embodiments according to the present invention will be described with reference to the accompanying drawings.

Figure 1A:
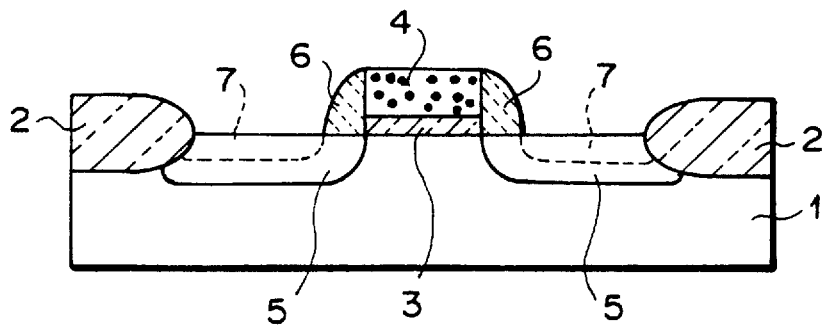
FIGS. 1A to 1E are cross-sectional views showing a series of steps according to a first embodiment of the present invention.
Figure 1B:
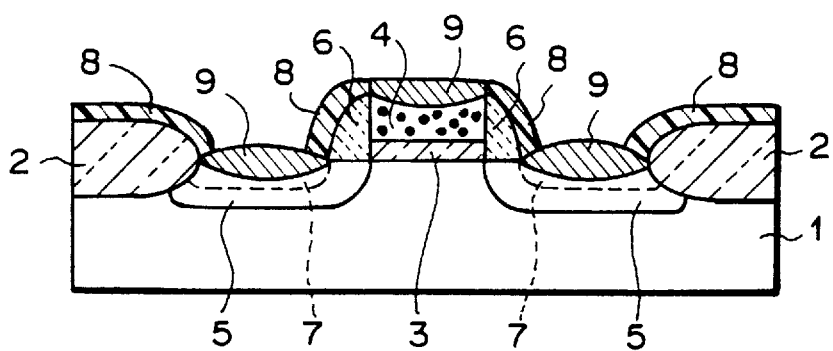
Figure 1C:
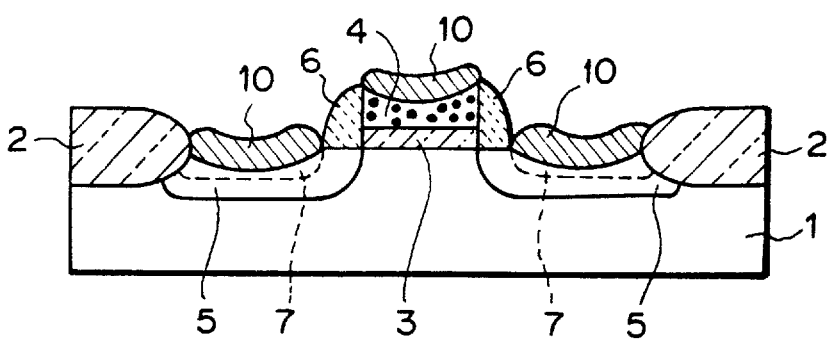
Figure 1D:
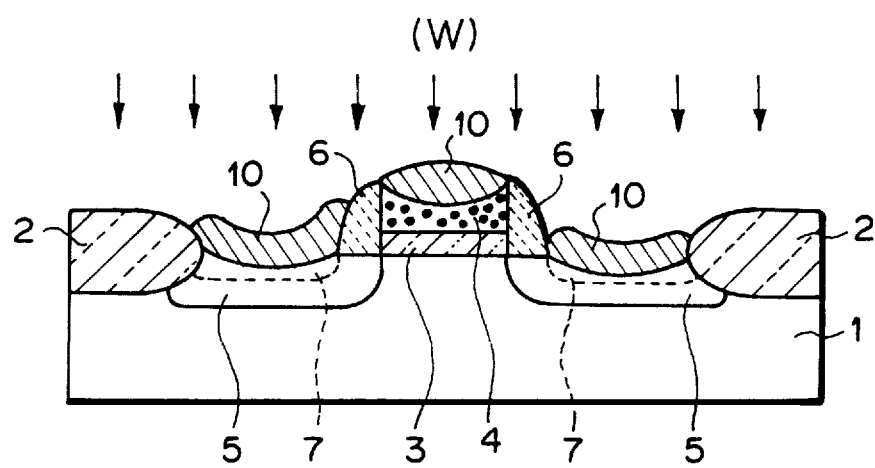
Figure 1E:
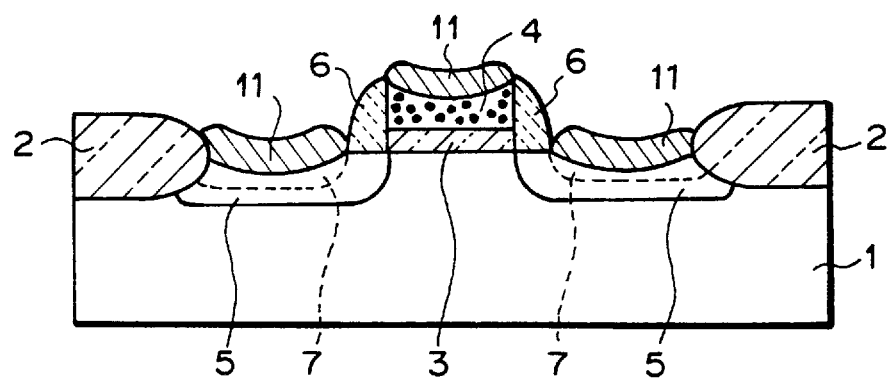

FIGS. 1A to 1E are cross-sectional views showing a manufacturing process of a first embodiment of the present invention in the manufacturing order. Particularly, FIGS. 1D and 1E show a part of the process which relates to the characteristic feature of the present invention. In this embodiment, W is used as the high melting-point metal to form Ti alloy.

First, as shown in FIG. 1A, an element isolation oxide film 2 is formed on a silicon substrate 1 and a gate oxide film 3 is formed on the silicon substrate 1, and then a polysilicon gate electrode 4 is formed on the gate oxide film 3. Subsequently, impurities are doped into the silicon substrate 1 by using the gate electrode 4 as a mask to form an LDD source/drain diffusion layer 5. Further, a side wall 6 is formed on the side surface of the gate electrode 4 by high-temperature oxide film growth, and then impurities of high concentration are ion-implanted to form a source/drain diffusion layer 7. Thereafter, an anneal treatment is performed to form a transistor having a MOS structure, and then As (arsenic) is ion-implanted into the source/drain diffusion layer 7 and the gate electrode 4 to make them amorphous in order to promote the silicification reaction.

Subsequently, as shown in FIG. 1B, a Ti film 8 is formed at a thickness of 300 Å by sputtering process while keeping the substrate temperature to 450° C., and the ramp anneal treatment is performed at 690° C. for 30 seconds to cause the silicification reaction only on the source/drain diffusion layer 7 and the gate electrode 4, thereby forming Ti silicide ($TiSi_2$) film 9 having C49 crystal structure.

Thereafter, as shown in FIG. 1C, the Ti film 8 which has not been silicified on the oxide films 2 and 6 is removed by using ammonium hydrogen peroxide water to selectively leave $TiSi_2$ film 9 on the source/drain diffusion layer 7 and on the gate electrode 4. Further, the anneal treatment is performed at 840° C. for 10 seconds to change $TiSi_2$ film 9 having the C49 crystal structure to $TiSi_2$ film 10 of C54 crystal structure which has low resistance and is more stable.

Subsequently, as shown in FIG. 1D, W is ion-implanted at a dose amount of 1E14 to 1E16/cm³ under 10 to 100 keV to form Ti alloy. In this case, when the Ti film 8 is formed at a thickness of 300 Å, the thickness of $TiSi_2$ film 10 which is formed in the previous step is equal to about 450 to 500 Å, so that the acceleration voltage of W is preferably set to 30 to 50 keV. Further, in this case, an oxide film may be beforehand formed so that the thickness thereof is small, and W is ion-implanted through this oxide film. In this case, the acceleration voltage for the ion-implantation must be increased in accordance with the thickness of the oxide film.

Thereafter, as shown in FIG. 1E, the anneal treatment is performed in order to oxidize W doped into the oxide film to make it insulated material and in order to make an alloy from W doped into $TiSi_2$ film 10 to form $TiW_xSi_y$ film 11. In this case, the anneal treatment may be performed at 850° C. for 30 seconds although the substrate temperature is dependent on the dose amount of W and the degree of desired heat resistance. The anneal treatment after the ion implantation of W may be performed after an interlayer film is deposited thereon after the ion implantation. Further, the anneal treatment may be performed under oxidizing atmosphere, and in this case the leakage between diffusion layers and between the diffusion layer and the gate electrode can be surely prevented.

FIGS. 2A to 2D are cross-sectional views showing process steps of a second embodiment according to the present invention.

Figure 2A:
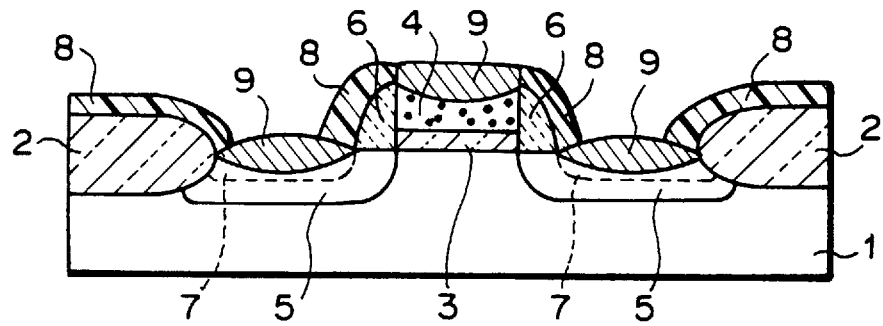
FIGS. 2A to 2D are cross-sectional views showing a series of steps according to a second embodiment of the present invention.

First, in FIG. 2A, as in the case of the first embodiment, a MOS type transistor is formed on a silicon substrate 1, and As is doped into the source/drain diffusion layer 7 and the gate electrode 4 to make them amorphous in order to promote the silicifying reaction. Thereafter, the substrate temperature is set to 450° C. and a Ti film 8 is formed at a thickness of 300 Å by the sputtering process. Thereafter, the ramp anneal treatment is performed at 690° C. for 30 seconds to induce the silicifying reaction only on the source/drain diffusion layer 7 and the gate electrode 4. Thereafter, the Ti film 8 which has not been silicified on the oxide film is removed by using ammonium hydrogen peroxide water, and $TiSi_2$ film 9 is selectively formed on the source/drain diffusion layer 7 and on the gate electrode 4.

Figure 2B:
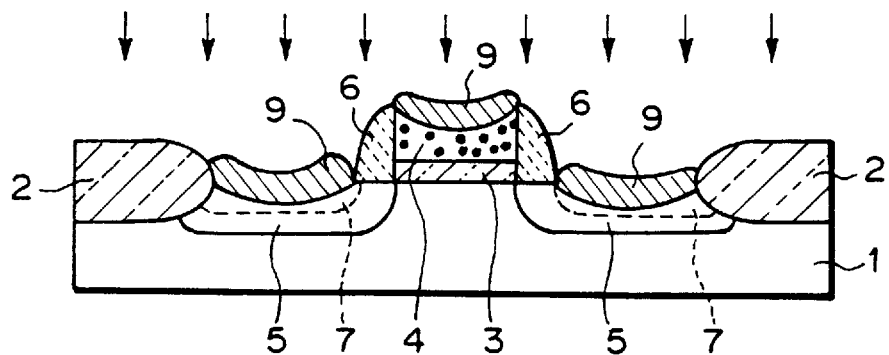
Figure 2C:
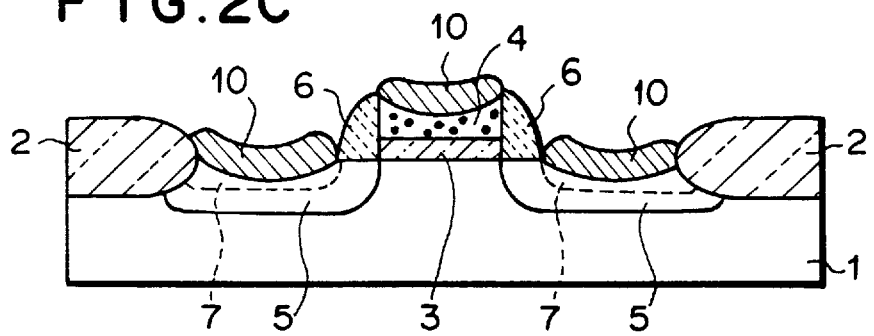
Figure 2D:
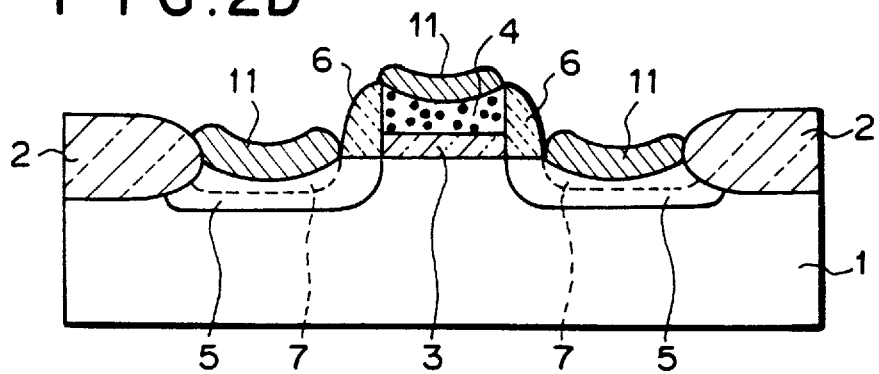

Subsequently, as shown in FIG. 2B, W is ion-implanted with implantation energy of 10 to 100 keV at a dose amount of 1E14 to 1E16/cm³. Further, as shown in FIG. 2C, the anneal treatment is performed at 840° C. for 10 seconds in order to change $TiSi_2$ film 9 to low-resistant and stable silicide 10 and oxidize W doped into the oxide film to make it insulated material, and in order to alloy W doped into $TiSi_2$ film 10 into $TiW_xSi_y$ film 11 as shown in FIG. 2D.

Here, in this embodiment, the oxide film may be beforehand formed so that the thickness thereof is small, and W may be ion-implanted through this oxide film. In this case, the acceleration voltage must be increased in accordance with the thickness of the oxide film as in the case of the first embodiment. Thereafter, the anneal treatment at 840° C. for 10 seconds is performed in order to oxidize W doped into the oxide film to make it insulated material and alloy W doped into $TiSi_2$ into $TiW_xSi_y$. The anneal treatment may be performed after the interlayer film is formed. The anneal treatment may be performed under the oxidizing atmosphere to surely prevent the leakage between the diffusion layers and between the diffusion layer and the gate electrode.

In the first and second embodiments, W is used as the material to form Ti alloy silicide. However, in place of W, Ta may be used. In this case, Ta is ion-implanted into $TiSi_2$ film, and then the anneal treatment is performed to form $TiTa_xSi_y$.

What is claimed is:

1. A semiconductor device manufacturing method comprising the steps of:

forming a Ti film on a layer containing silicon;

performing a heat treatment to react the Ti film with the silicon to form Ti silicide film;

removing a non-reacted portion of the Ti film;

subjecting the Ti silicide film to ion implantation of high melting-point metal other than Ti; and performing an anneal treatment to react the implanted high melting-point metal with Ti silicide film to form a Ti alloy silicide film.

2. The semiconductor device manufacturing method as claimed in claim 1, wherein the high melting-point metal to be ion-implanted into the Ti silicide film comprises W or Ta.

3. The semiconductor device manufacturing method as claimed in claim 1, wherein the layer containing the silicon is an impurity diffusion layer formed on a silicon substrate.

4. The semiconductor device manufacturing method as claimed in claim 1, wherein the layer containing the silicon is a polysilicon layer.

5. The semiconductor device manufacturing method as claimed in claim 1, wherein before the ion implantation of the high melting-point metal, an oxide thin film is formed so as to cover the Ti silicide film, and the high melting-point metal is ion-implanted through the oxide thin film.

6. The semiconductor device manufacturing method as claimed in claim 1, wherein the ion-implantation of the high melting-point metal is performed with an acceleration energy of 10 to 100 keV at a dose amount of 1E14 to $1E16/cm^3$.

7. The semiconductor device manufacturing method as claimed in claim 1, wherein the anneal treatment is performed under oxidizing atmosphere.

* * * * *